(12) United States Patent
Reddy et al.

(10) Patent No.: US 8,822,123 B2
(45) Date of Patent: Sep. 2, 2014

(54) POLYMERIC MATERIALS AND METHODS FOR MAKING THE POLYMERIC MATERIALS

(75) Inventors: Ashok T. Reddy, Louisville, KY (US); Joseph E. Wentworth, Memphis, IN (US)

(73) Assignee: Momentive Specialty Chemicals Inc., Columbus, OH (US)

( * ) Notice: Subject to any disclaimer, the term of this patent is extended or adjusted under 35 U.S.C. 154(b) by 0 days.

(21) Appl. No.: 13/549,131

(22) Filed: Jul. 13, 2012

(65) Prior Publication Data

US 2014/0017612 A1 Jan. 16, 2014

(51) Int. Cl.
*G03F 7/023* (2006.01)
*C08G 8/24* (2006.01)
*C08G 63/00* (2006.01)
*C08G 8/04* (2006.01)

(52) U.S. Cl.
CPC ...... *C08G 63/00* (2013.01); *C08G 8/04* (2013.01); *G03F 7/0236* (2013.01); *C08G 8/24* (2013.01)
USPC ............................. 430/192; 430/165; 430/193

(58) Field of Classification Search
CPC ............................... G03F 7/0236; C08G 8/24
USPC ............... 430/192, 165, 193; 528/129, 155
See application file for complete search history.

(56) References Cited

U.S. PATENT DOCUMENTS

| | | | |
|---|---|---|---|
| 4,988,601 A * | 1/1991 | Ushirogouchi et al. ...... 430/192 |
| 5,019,479 A | 5/1991 | Oka et al. |
| 5,178,986 A | 1/1993 | Zampini et al. |
| 5,225,311 A | 7/1993 | Nakano et al. |
| 5,346,799 A | 9/1994 | Jeffries, III et al. |
| 5,451,484 A | 9/1995 | Nagase et al. |
| 5,468,590 A | 11/1995 | Hashimoto et al. |
| 5,478,691 A | 12/1995 | Miyashita et al. |
| 5,635,329 A | 6/1997 | Nishi et al. |
| 5,736,292 A | 4/1998 | Ida et al. |
| 5,948,587 A | 9/1999 | Kawabe et al. |
| 6,171,750 B1 | 1/2001 | Inomata et al. |

FOREIGN PATENT DOCUMENTS

EP 0435502 A1 7/1991

* cited by examiner

*Primary Examiner* — John Chu

(57) ABSTRACT

Polymeric materials, methods for making the polymeric materials, and photoresist formulations utilizing the polymeric materials are disclosed. In one aspect, a polymeric material is provided including a condensation product of a reaction mixture comprising an aldehyde with a phenolic monomer composition comprising m-cresol, p-cresol, 3,5-dimethyl phenol, and 2,5-dimethyl phenol. The polymeric material may be further contacted with a photoactive compound and a solvent to form a photoresist formulation.

13 Claims, No Drawings

POLYMERIC MATERIALS AND METHODS FOR MAKING THE POLYMERIC MATERIALS

BACKGROUND OF THE INVENTION

1. Field of the Invention

The invention relates to a process to prepare film forming polymeric material compositions, which may be useful as a component in photoresist formulations.

2. Background of the Invention

Photoresist formulations are used to create and transfer an image pattern onto a selected substrate surface, such as silicon wafer used in making integrated circuits or computer chips. The photoresist formulations are spin-coated and baked on the silicon wafer; the coated wafers are exposed to a selected radiation through a photomask that contains an image pattern to be transferred on to a silicon wafer. The radiation exposed areas of the photoresist film undergo photochemical reactions changing the exposed portions of the photoresist film. In a positive tone resist, the exposed areas of the film become more soluble than unexposed film in an alkaline developer thereby creating a difference in solubility. This difference in alkaline solubility creates a pattern in the photoresist layer that is critical for further process steps such as etching of substrate and deposition of a conductive metal to create inter-connects on silicon wafer.

Due to shrinking patterns, photoresist formulations capable of forming more defined and smaller patterns are required. However, current photoresist formulations have been observed to lose definition at the increasing processing requirements of the new image transfer pattern processes.

It would be desirable to form photoresist formulations with improved properties for use in the higher processing requirement methods for image pattern transfer to substrates.

SUMMARY OF THE INVENTION

Aspects of the invention are directed to polymeric materials, forming the polymeric materials, and photoresist formulations utilizing the polymeric materials are disclosed.

In one aspect, a polymeric material is provided including a condensation product of a reaction mixture comprising an aldehyde with a phenolic monomer composition comprising m-cresol, p-cresol, 3,5-dimethyl phenol, and 2,5-dimethyl phenol.

In one aspect, a method is provided for forming a polymeric material including charging m-cresol, p-cresol, 3,5-dimethyl phenol, 2,5-dimethyl phenol, and an acid catalyst to a reactor to form a reaction mixture, heating the reaction mixture to a temperature from about 70° C. to about 110° C., charging an aldehyde to the reaction mixture, and condensing the reaction mixture. The method may further include contacting the polymeric material with a photoactive compound and a solvent to form a radiation sensitive resin.

In one aspect, a radiation sensitive resin composition is provided including a polymeric material, a photoactive compound, and a solvent, wherein the polymeric material comprises a condensation product of a reaction mixture of an aldehyde with a phenolic monomer composition including m-cresol, p-cresol, 3,5-dimethyl phenol, and 2,5-dimethyl phenol.

DETAILED DESCRIPTION

Embodiments of the invention are directed to polymeric materials, forming the polymeric materials, and photoresist formulations utilizing the polymeric materials.

The polymeric material may be obtained by a condensation process of an aldehyde with phenolic monomer composition including m-cresol, p-cresol, 3,5-dimethyl phenol, and 2,5-dimethyl phenol. The condensation process may be a polycondensation process under acidic conditions.

It was surprisingly and unexpectedly discovered that a polymeric material made with a phenol monomer composition of m-cresol, p-cresol, 3,5-dimethyl phenol, and 2,5-dimethyl phenol had improved results over polymeric materials made with similar phenol compositions. For example, it was observed that the polymeric materials made from the novel phenol monomer composition described herein formed cresol novolac polymeric materials (resins) having higher glass transition temperatures (Tg) than in conventional cresol novolac polymeric materials (resins), such as about 10° C. to 20° C. higher, and are suitable for use as a polymeric binder in high resolution photoresist formulations. It is believed that the use of 2,5-dimethyl phenol as a fourth monomer in combination with m-cresol, p-cresol, and 3,5-dimethyl phenol, is involved in obtaining lower viscosity polymeric materials while not adversely impacting the Tg and alkaline dissolution rates.

The phenol monomer composition includes m-cresol, p-cresol, 3,5-dimethyl phenol, and 2,5-dimethyl phenol. The phenol monomer composition is mixed together with an aldehyde to form a reaction mixture. In one embodiment, the phenol monomer composition includes from about 50% to about 70%, such as from about 55% to about 65%, by weight of m-cresol, about 20% to about 30%, such as from about 25% to about 28%, by weight of p-cresol, about 5% to about 20%, such as from about 10% to about 15%, by weight of 3,5-dimethyl phenol, and about 5% to about 15%, such as about 10%, by weight of 2,5-dimethyl phenol, respectively of the phenol monomer composition. The total amount of the components of the phenol monomer composition is 100% by weight. In one embodiment the phenol monomer composition consists essentially of, or consists of, m-cresol, p-cresol, 3,5-dimethyl phenol, and 2,5-dimethyl phenol.

The phenol monomer composition may be reacted in the presence of an acid catalyst. The acid catalyst comprises from about 0.1% to about 4%, from about 1% to about 2%, by weight of the reaction mixture made from the phenol monomer composition.

The acid catalyst may be an inorganic acid, an organic acid, an anhydride, an ion-exchange resin, and combinations thereof. Examples of an inorganic acid include hydrochloric acid, nitric acid, sulphuric acid, and combinations thereof. Examples of organic acids include oxalic acid, formic acid, acetic acid, citric acid, and combinations thereof. Suitable anhydrides include anhydrides capable of generating acid in situ the reaction mixture. Examples of suitable anhydrides include cyclical organic anhydrides, such as anhydrides selected from the group of maleic anhydride, succinic anhydride, and combinations thereof. The acid catalyst may be an ion-exchange resin.

The ion-exchange resin may have strongly acidic groups such as sulfonic acid groups, for example, styrene divinylbenzene co-polymer with sulfonic acid groups. Examples of the ion-exchange resin may have strongly acidic groups include DOWEX™ strong acid cation resins and Amberlyst™ polymeric catalysts. The ion-exchange resin may also be an ion-exchange resin with weakly acidic groups such as carboxylic groups, for example, polyacrylic carboxylic acid. Examples of the ion-exchange resin with weakly acidic groups include DOWEX™ MAC-3 and Amberlite™ type resins. The ion-exchange resin may also have both strongly acidic groups and weakly acidic groups.

The aldehyde may be a carbonyl compound represented by the formula (I):

$$R^1—C(O)—R^2, \quad (I).$$

In formula (I), $R^1$ and $R^2$ may each be independently selected from the group consisting of a hydrogen atom, an alkyl group, an alkenyl group, an aralkyl group, an aryl group, and combinations thereof. $R^1$ and $R^2$ may be the same or a different functional group. Examples of suitable carbonyl compounds may be selected from the group of formaldehyde, paraformaldehyde, benzaldehyde, furfural, acetaldehyde, and combinations thereof. One example of a suitable aldehyde to mix with the phenol monomer composition described herein is formaldehyde. The aldehyde may be provided in a solution form with water, for example, formaldehyde may be provided as a 37% or 50% formaldehyde solution.

The aldehyde is added in an amount to form a novolac polymeric material. The aldehyde is present in the reaction mixture at a molar ratio of aldehyde to the total moles of phenolic monomers of less than 1:1, such as from about 0.50:1 to about 0.85:1 (about 50 mole % to about 85 mole % aldehyde), for example from about 0.6:1 to about 0.8:1 (about 60 mole % to about 80 mole % aldehyde).

Optionally, a solvent may be added to the reaction mixture for the condensation reaction. Suitable solvents may be organic solvents including alcohols, such as methanol, ethanol, propanol, butanol and propylene glycol monomethyl ether; cyclic ethers, such as tetrahydrofuran and dioxane; ketones, such as methyl ethyl ketone, methyl isobutyl ketone and 2-heptanone; esters, such as 1-methoxy-2-propanol acetate, 1-butyl acetate and ethyl lactate, aromatics, such as toluene and xylenes and combinations thereof. The solvent may be present in an amount from 10% to 20% by weight based on the total weight of the phenol monomer charge. Alternatively, the reaction mixture is free of organic solvents.

The reaction mixture may be formed by charging m-cresol, p-cresol, 3,5-dimethyl phenol, 2,5-dimethyl phenol, and an acid catalyst, to a reactor to form a reaction mixture, heating the reaction mixture to a desired temperature, charging an aldehyde to the reaction mixture, and condensing the reaction mixture.

The phenolic monomers and acid catalyst may be provided in the amounts described herein. The reaction mixture may be heated to a temperature from about 70° C. to about 110° C., such as from about 95° C. to about 105° C. The aldehyde component may be provided in the necessary amounts to have the molar rations as described herein.

In one embodiment, the condensation of the reaction mixture may be condensed by a process including refluxing the reaction mixture for 4 to 8 hours at a temperature from about 70° C. to about 110° C., such as from about 95° C. to about 105° C., and at atmospheric pressure, distilling the reaction mixture to a temperature from about 200° C. to about 230° C., and at atmospheric pressure for about 4 to about 10 hours, and then removing residual water and free monomers under full vacuum for about 30 to 60 minutes while holding the reaction temperature from about 200° C. to about 230° C.

Optionally, p-cresol may be added to the composition after the reaction of the aldehyde with the phenolic monomer composition. It has been surprising and unexpectedly discovered that post-reaction adding of p-cresol as a solvent improves the processability of the final material (resin). The post-reaction p-cresol may be added after the reflux processing step and before the distillation steps of the process, for example, at the end of reflux time. The p-cresol may be added in an amount from about 5% to about 20% by weight, such as from about 5% to 10% by weight, of additional p-cresol based on total phenolic monomer composition charge.

It is believed that the addition p-cresol at the end of reflux time facilitate uniform mixing of the reaction mixture. It has been observed that when molecular weight builds up during the synthesis, the reaction mixture becomes highly viscous and it is difficult to mix uniformly. It has been further observed that the uniform mixing allows for obtaining a targeted alkaline dissolution rate consistently as well as lowering alkaline dissolution rates. Another advantage of using p-cresol as a solvent is that the p-cresol minimizes any additional potential contamination of the final material by a conventional organic solvent described herein.

The present invention describes a process to synthesize polymeric materials, such as novel cresol novolac resins, having higher glass transition temperatures (Tg) than existing materials as shown in the examples below, and can be used as a polymeric material in high resolution photoresist formulations.

The polymeric material formed from the process described herein exhibits a glass transition temperature (Tg) from about 110° C. to about 135° C., such as from about 110° C. to about 125° C. It is believed that the use of 3,5-dimethyl phenol obtains increasing Tg polymers and such effect does not require an excess concentration. It was also observed that only about 5% to about 20% by weight of 3,5-dimethyl phenol is needed to achieve increased Tg performance without impacting other critical material properties, such as alkaline dissolution rate. As shown in the examples below, Examples 8 to 16, from Table-1, illustrate that the use of only about 15% of 3,5-dimethyl phenol is needed to obtain Tg from about 117° C. to about 125° C. and also shows that the Tg of final polymeric material increases as the molecular weight of the polymeric material increased.

The polymeric material formed from the process exhibits a solution viscosity from about 30 centistokes (cSt) to about 95 cSt, such as about 35 cSt to about 80 cSt, for example, from about 40 cSt to about 60 cSt.

The polymeric materials formed in this process have been observed to exhibit effective alkaline dissolution rates in 2.38N (Normal) aqueous tetra methyl ammonium hydroxide (TMAH) solution. The dissolution rates of the polymeric materials (resins) may be from about 20 Å/Sec. to about 600 Å/Sec., such as from about 40 Å/Sec. to about 400 Å/Sec., for example, from about 50 Å/Sec. to about 300 Å/Sec.

The polymeric material made from the phenol monomer composition was also observed, when used as a polymeric binder, to have significant improvement in thermal flow stability of photoresist formulations with the photoresist formulations being able withstand post-bake temperatures of 130° C. to 140° C. without impacting the image resolution. For example, when the compositions used herein are used as polymeric binders in typical i-line and g-line photoresist formulations consisting of o-diazonathaquinones as photoactive compounds, the resulting photoresist materials were observed to have a 10° C. to 15° C. improvement in thermal flow stability over current polymeric binders that are being used in these applications without any loss of photospeed or image resolution.

In one aspect, a radiation sensitive resin composition is provided including a polymeric material as described herein, a photoactive compound, and a solvent.

A photoresist formulation comprising a radiation sensitive composition may be formed by contacting and/or reacting the polymeric material described herein with a photoactive compound and a solvent.

The photoactive compound may be a quinone-based compound. Suitable quinine-based compounds may include, and are not limited to, a 1,2-quinonediazide compound, a quinonediazidosulfonic acid ester compound, a naphthoquinonediazide, and combinations thereof. The photoactive compound may be present in an amount from about 1 to about 10 parts by weight, such as from about 2 to about 5 parts by weight, to 100 parts by weight of the polymeric material.

The solvent may be an organic solvent selected from the group of ethers, esters, ketones, alkyl ether acetates, acid esters, aromatic hydrocarbons, fatty acids and combinations thereof. Examples of suitable organic solvents including glycol ethers, such as propylene glycol monomethyl ether and propylene glycol monoethyl ether; cellosolve esters, such as methyl cellosolve acetate and ethyl cellosolve acetate; propylene glycol akyl ether acetates, such as propylene glycol methyl ether acetate and propylene glycol ethyl ether acetate; monooxymonocarboxylic acid esters, such as methyl 2-oxypropionate and ethyl 2-oxypropionate; esters, such as ethyl acetate, butyl acetate, and ethyl lactate, cyclic ethers, such as tetrahydrofuran and dioxane; ketones, such as methyl ethyl ketone, methyl isobutyl ketone, cyclohexanone, and 2-heptanone; aromatic hydrocarbons such as toluene and xylene; and combinations thereof.

The photoresist formulation may comprise at least 50 percent solvent by weight, such as from about 65 to about 95 percent solvent by weight, based on 100 percent by weight of the total weight of the polymeric binder and photoactive compound.

The radiation sensitive composition may further include various additives that are commonly used in photoresist compositions such as flow agents, anti-striation agents, plasticizers, compatibilizing agents and anti-reflective agents, to enhance the performance of the photoresist films. These additives may be used in amounts ranging from about 0.01 to 2 percent by total weight.

EXAMPLES

In order that those skilled in the art may more fully understand the invention presented herein, the following procedures and examples are set forth. The examples and comparative examples were prepared and tested using the methods shown below. For the following examples, the data was derived in accordance with the following procedures.

The viscosity herein was measured for a Cannon-Fenske (CF) solution viscosity of the polymeric binders using 30% solids in Dowanol PMA at 25° C.

The alkaline dissolution rates herein was measured using standard 2.38N (Normal) aqueous tetra methyl ammonium hydroxide (TMAH) solution developer, silicon wafers are spin-coated and baked at 110° C. per 60 seconds.

The Weight Average Molecular Weight (Mw) herein is measured using size exclusion gel permeation chromatography (GPC) which was calibrated using polystyrene molecular weight standards. A sample is dissolved in tetrahydrofuran and the resulting solution is run through a Hewlett Packard model 1100HPLC.

The Glass Transition Temperature ($T_g$) of the polymeric binders was measured by Differential Scanning calorimetry (DSC) at a heat-up rate of 10° C./minute at ambient atmosphere. The temperature of the DSC was calibrated using an Indium and a Tin standard. The DSC instrument was a Perkin Elmer DSC Model 7.

The experimental process to form the polymeric binders was performed as follows, which polymeric binders are cresol novolac resins.

Synthesis Method-1

To a 2 liter 4-neck round bottom reaction flask, that equipped with a cooling condenser, thermo-couple and a mechanical agitator, charged m-cresol, p-cresol, 3,5-dimethyl phenol, and optionally, 2,5-dimethylphenol in the amounts shown in Table 1 below. Additionally, 2% by weight of oxalic acid was charged with the monomers. The reaction mixture is then heated to 95° C. The components and reaction mixture may be further subjected to agitation at various processing steps in the synthesis method described herein, such as when charging the phenolic monomers.

Based on total cresol charge, 78 mole % of formaldehyde was added to the reaction mixture over a period of 60 minutes. Then the reaction mixture is refluxed for 5 hours at 95° C.

At the end of reflux, the condenser was replaced with a distillation sidearm connected to a distillate receiver that is fitted with a cooling condenser. Atmospheric distillation is performed until the reaction temperature achieves about 210° C.

The distillate receiver is then emptied and the reaction flask is gradually connected to a vacuum source to remove residual water and free monomers. The reaction mixture is then held under full vacuum for about 60 minutes while maintaining the reaction temperature from about 210° C. After most of the free monomers are distilled off, vacuum is released and the hot molten material is poured into a clean pan.

Samples 1-12 were made with Synthesis Method-1.

Synthesis Method-2

To a 2 liter 4-neck round bottom reaction flask, that equipped with a cooling condenser, thermo-couple and a mechanical agitator, charged m-cresol, p-cresol, 3,5-dimethyl phenol, and optionally, 2,5-dimethylphenol in the amounts shown in Table 1 below. Additionally, 2% by weight of oxalic acid was charged with the monomers. The reaction mixture is then heated to 95° C. The components and reaction mixture may be further subjected to agitation at various processing steps in the synthesis method described herein, such as when charging the phenolic monomers.

Based on total cresol charge, 78 mole % of formaldehyde was added to the reaction mixture over a period of 60 minutes. Then the reaction mixture is refluxed for 5 hours at 95° C.

At the end of the reflux added 5% by weight of additional p-cresol based on the total monomer charge of the reaction mixture to facilitate the agitation of highly viscous reaction mixture.

Then the condenser was replaced with a distillation sidearm connected to a distillate receiver that is fitted with a cooling condenser. Atmospheric distillation is performed until the reaction temperature achieves about 210° C.

The distillate receiver is then emptied and the reaction flask is gradually connected to a vacuum source to remove residual water and free monomers. The reaction mixture is then held under full vacuum for 60 minutes while maintaining the reaction temperature at 210° C. After most of the free monomers and additional p-cresol is distilled off, vacuum is released and the molten material is poured into a clean pan.

Samples 13-16 were made with the use of additional p-cresol as a solvent after the reflex process as described above in Synthesis Method-2.

The respective polymeric materials (resins) were then tested. The test data for several different phenol monomer compositions and are shown in Table 1 below.

TABLE 1

Polymeric Binder Compositions

| Sample | Weight percent of: m-cresol/ p-cresol/ 3,5-dimethylphenol/ 2,5-dimehtylphenol | Mole Ratio: Formaldehyde/ Total monomer charge | Solution Viscosity (cSt) | Alkaline Dissolution Rate (Å/Sec.) | MW by GPC | Tg (°C.) |
|---|---|---|---|---|---|---|
| 1 | 60/20/20/0 | 0.7675 | 35.48 | 267.80 | 5677 | 108.90 |
| 2 | 60/20/20/0 | 0.7775 | 44.86 | 194.98 | 8013 | 118.10 |
| 3 | 65/25/10/0 | 0.765 | 54.13 | 244.9 | 10684 | 109.90 |
| 4 | 65/25/10/0 | 0.7725 | 66.63 | 181.51 | 14375 | 120.50 |
| 5 | 62/28/10/0 | 0.7675 | 89.07 | 98.05 | 21047 | 117.92 |
| 6 | 60/28/10/0 | 0.7675 | 92.69 | 75.18 | 25734 | 123.43 |
| 7 | 64/26/10/0 | 0.7750 | 86.91 | 110.68 | 20838 | 124.48 |
| 8 | 50/25/15/10 | 0.7500 | 37.70 | 340.78 | 6001 | 117.49 |
| 9 | 50/25/15/10 | 0.7600 | 41.75 | 212.16 | 7728 | 119.43 |
| 10 | 50/25/15/10 | 0.7750 | 54.03 | 129.21 | 11926 | 123.54 |
| 11 | 50/25/15/10 | 0.7800 | 57.97 | 95.21 | 13226 | 125.04 |
| 12 | 50/25/15/10 | 0.7750 | 54.40 | 128.4 | 12850 | 123.99 |
| 13 | 50/25/15/10 | 0.7800 | 40.40 | 218.66 | 6851 | 116.24 |
| 14 | 50/25/15/10 | 0.7750 | 42.17 | 193.19 | 7398 | 119.41 |
| 15 | 50/25/15/10 | 0.7825 | 46.33 | 168.25 | 8787 | 123.28 |
| 16 | 50/25/15/10 | 0.7890 | 59.38 | 87.66 | 13791 | N/A |

Table 1 illustrates several properties of the phenol monomer compositions described herein. Samples 1 and 2 exhibited polymeric material Tg is within the acceptable range for this application and exhibited less than desirable resolution characteristics for photoresist applications. Samples 3 to 7 were observed to have improved resolution characteristics over the polymeric material in Samples 1 and 2 by increasing the p-cresol content while lowering the concentration of other monomers in the composition. Surprisingly, the increased p-cresol content resulted is a significant improvement in Tg of the polymeric material Samples 3 to 7. Also, this surprising Tg improvement was achieved without a reduction or significant change in any of the alkaline dissolution properties of Samples 3 to 7. However, as illustrated in the Table 1, the solution viscosity of these samples is very high and outside the acceptable range for the application of the polymeric materials (resins) for photoresist materials.

2,5-dimethyl phenol was as added as a fourth monomer in Samples 8 to 16. Samples 8 to 16 were observed to reduce the solution viscosity while retaining both high Tg and good alkaline dissolution property.

Additional p-cresol was added to the compositions of Samples 13 to 16. The p-cresol was added after the reaction of the phenolic monomer composition at the end of the reflux period, and prior to a distillation step using agitation. By adding p-cresol after reflux, the incorporation of additional p-cresol into the polymer backbone was minimized. As shown in the Table 1, the use of post added p-cresol as solvent exhibited reduced viscosity of the reaction mixture, thereby providing improved processability of the polymeric materials. Samples 13 to 16 were observed to be less viscous and to mix more uniformly than the samples without the post-addition p-cresol. Sample 16 exhibited the ability of this process to produce less than 100 Å/sec dissolution rate polymeric material batch without any mixing problems during the atmospheric distillation step.

While the present invention has been described and illustrated by reference to particular embodiments and examples, those of ordinary skill in the art will appreciate that the invention lends itself to variations not necessarily illustrated herein. For this reason, then, reference should be made solely to the appended claims for purposes of determining the true scope of the present invention.

What is claimed is:

1. A method for forming a polymeric material, comprising:
charging m-cresol, p-cresol, 3,5-dimethyl phenol, 2,5-dimethyl phenol, and an acid catalyst to a reactor to form a reaction mixture;
heating the reaction mixture to a temperature from about 70° C. to about 110° C.;
charging an aldehyde to the reaction mixture; and
condensing the reaction mixture, wherein the condensing the reaction mixture comprises:
refluxing the reaction mixture for a first period of time;
distilling the reaction mixture for a second period of time; and
removing residual water and free monomers; and
adding p-cresol after the refluxing the reaction mixture and prior to the distilling the reaction mixture.

2. The method of claim 1, wherein the charging m-cresol, p-cresol, 3,5-dimethyl phenol, 2,5-dimethyl phenol, and an acid catalyst comprises charging:
about 50% to about 70% by weight of m-cresol;
about 20% to about 30% by weight of p-cresol;
about 5% to about 20% by weight of 3,5-dimethyl phenol;
about 5% to about 15% by weight of 2,5-dimethyl phenol; and
about 1% to about 2% by weight of the acid catalyst.

3. The method of claim 1, wherein the charging the aldehyde to the reaction mixture comprises charging aldehyde at a molar ratio of aldehyde to total moles of phenolic monomers of less than 1:1.

4. The method of claim 1, further comprising contacting the polymeric material with a photoactive compound and a solvent.

5. The method of claim 1, wherein the polymeric material has a glass transition temperature from about 110° C. to about 135° C.

6. The method of claim 1, wherein the aldehyde is a carbonyl compound represented by the formula (I):

$$R^1\text{—}C(O)\text{—}R^2, \tag{I}$$

wherein $R^1$ and $R^2$ are each selected from the group consisting of a hydrogen atom, an alkyl group, an alkenyl group, and aralkyl group, and aryl group, and combinations thereof.

7. The method of claim 6, wherein the aldehyde is selected from the group consisting of formaldehyde, paraformaldehyde, benzaldehyde, furfural, acetaldehyde, and combinations thereof.

8. The method of claim 1, wherein the polymeric material has a viscosity from about 30 centistokes to about 95 centistokes.

9. The method of claim 1, wherein the acid catalyst is selected from the group consisting of an inorganic acid, an organic acid, an anhydride, an ion-exchange resin, and combinations thereof.

10. The method of claim 9, wherein the acid catalyst is selected from the group consisting of oxalic acid, formic acid, acetic acid, hydrochloric acid, nitric acid, sulphuric acid, citric acid, maleic anhydride, succinic anhydride, styrene divinylbenzene co-polymer with sulfonic acid groups, polyacrylic carboxylic acid, and combinations thereof.

11. The method of claim 4, wherein the photoactive compound comprises a 1,2-quinonediazide compound, a quinonediazidosulfonic acid ester compound, a naphthoquinonediazide, and combinations thereof.

12. The method of claim 4, wherein the solvent comprises an organic solvent selected from the group of alcohols, ethers, esters, ketones, alkyl ether acetates, acid esters, aromatic hydrocarbons, fatty acids, amides, and combinations thereof.

13. The method of claim 1, wherein the polymeric material has an alkaline dissolution rate from about 20 to about 600 Å/Sec.

* * * * *